(12) United States Patent
Kono

(10) Patent No.: US 7,733,717 B2
(45) Date of Patent: Jun. 8, 2010

(54) MEMORY SYSTEM HAVING DISTRIBUTED READ ACCESS DELAYS

(75) Inventor: Fumihiro Kono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 119 days.

(21) Appl. No.: 12/183,248

(22) Filed: Jul. 31, 2008

(65) Prior Publication Data

US 2010/0027357 A1 Feb. 4, 2010

(51) Int. Cl.
*G11C 7/00* (2006.01)
(52) U.S. Cl. .................................. 365/194; 365/230.06
(58) Field of Classification Search ................. 365/194, 365/230.06
See application file for complete search history.

(56) References Cited

U.S. PATENT DOCUMENTS 6,390,579 B1 * 5/2002 Roylance et al. ............... 347/9
7,058,678 B2 * 6/2006 Luick .......................... 708/670
7,375,671 B1 * 5/2008 Brubaker .................... 341/145

OTHER PUBLICATIONS

Pille, et al., "Implem. of the CELL Broadband Engine in a 65nm SOI Tech. Featuring Dual-Supply SRAM Arrays Supporting 6GHz at 1.3V", 2007 IEEE Int'l Solid State Circuits Conf.

* cited by examiner

*Primary Examiner*—Michael T Tran
(74) *Attorney, Agent, or Firm*—Law Offices of Mark L. Berrier

(57) ABSTRACT

A system having a plurality of memory cells organized in rows and columns. Each column includes upper and lower sets of memory cells connected to corresponding common upper/lower bit lines. Each column includes an evaluation circuit coupled to the upper and lower bit lines and configured to evaluate signals on these bit lines and to produce an output signal. Each of the upper and lower bit lines has an associated bit line delay, one of which is greater than the other. The evaluation circuit has first and second inputs which have associated evaluation delays, one of which is greater than the other. In each column, the bit line having the greater bit line delay is connected to the evaluation circuit input having the smaller evaluation delay, and the bit line having the smaller bit line delay is connected to the evaluation circuit input having the greater evaluation delay.

20 Claims, 3 Drawing Sheets

MEMORY SYSTEM HAVING DISTRIBUTED READ ACCESS DELAYS

BACKGROUND

1. Field of the Invention

The invention relates generally to memory systems, and more particularly to systems for increasing the worst-case speed with which memory cells can be read.

2. Related Art

There is a continuing demand in the design of electronic circuits for increased computational power and decreased size and power consumption. These goals are achieved in various ways, such as by improving the physical characteristics of the devices. For example, computational power may be increased by developing components that can operate at higher clock speeds than previous components. Device size may be reduced by using technologies that allow smaller features to be constructed on an integrated circuit die. Lower power consumption may be achieved by using Lower power supply voltages. Many other techniques are also used to meet these demands.

There are, however, physical limitations to some of these techniques. For instance, the frequency and I clock signal used in a digital circuit cannot be increased beyond the point at which the components that use the clock signal become unstable. Similarly, a power supply voltage cannot be reduced to a level at which the components operating on this supply voltage no longer function properly, and the physical size of a circuit components cannot be reduced to a size which is too small to be resolved using available process technologies. It is therefore necessary to find better ways to take advantage of the available technologies.

Once such way of taking advantage of available technologies in the context of memory devices is the use of a hierarchical bit line scheme to read SRAM memory cells. In a conventional system, many SRAM cells (e.g., 128) might be connected to a single, common bit line. Typically, there is a small amount of leakage current between each SRAM cell and the bit line. As a result of the current leaks in all of the cells connected to the bit line, it can be difficult to reliably read data from a single one of the cells. Hierarchical bit line schemes were developed to allow the SRAM cells to be grouped together in smaller numbers so that each cell could be reliably read, despite the leakage from the smaller number of cells.

In a conventional hierarchical bit line scheme, a first group of cells (16, for example) is coupled to a first bit line, while a second group of cells is coupled to a second bit line. Each of the bit lines is input to an evaluation circuit. The outputs of multiple evaluation circuits are then input to further evaluation circuitry. In this manner, a number of cells equivalent to a conventional system (e.g., 128) can be read, even though the cells are grouped into smaller numbers (e.g., 16) on each common bit line.

Even this hierarchical bit line scheme can be improved, however. Because of the physical layout of each SRAM cell, there are certain orientations of the cells that enable optimization of the overall layout of an array of cells. Normally, the cells connected to a particular bit line are arranged in a column. Every second cell in the column can be flipped so that it is a mirror image of the adjacent cells. This allows two adjacent cells to be connected to the bit line at a single junction, which reduces the capacitance of the bit line and thereby increases the speed of the bit line.

As a result of the physical layout of the individual SRAM cells, cells in adjacent columns are flipped with respect to each other, but are not mirror images of each other. Consequently, one column of N cells will have N/2 junctions between the cells and the corresponding common bit line, while the adjacent column of N cells will have N/2+1 junctions between the cells and the common bit line for that column. The columns in an array of memory cells will therefore alternate between N/2 junctions and N/2+1 junctions. Because the alternating bit lines have different numbers of junctions, they will have slightly different capacitances and slightly different speeds. This difference is aggravated by the fact that a typical evaluation circuit based on a NAND gate has one input which is slightly slower than the other. Because all of the memory cells must operate according to the same clock signal, the frequency of this clock signal must be low enough to accommodate the worst case of reading a cell connected to a slower one of the bit lines which is coupled to the slower input of the corresponding evaluation circuit.

It would therefore be desirable to provide systems and methods for reducing these worst case delays.

SUMMARY OF THE INVENTION

One or more of the problems outlined above may be solved by the various embodiments of the invention. Broadly speaking, the invention includes systems for minimizing the worst-case delay in reading the memory cells by distributing the delays associated with the different components of the system. More particularly, the worst-case delay is minimized by ensuring that the bit line having the greater delay is connected to the evaluation circuit input having the smaller delay, and vice versa. Also, the deviation of the delay times for accessing the different memory cells is reduced. This has the added benefit of increasing the manufacturing yield of the devices, as the reduced deviation reduces the number of devices that fail to meet design criteria.

In one embodiment, a system has a plurality of memory cells organized in rows and columns. Each column includes upper and lower sets of memory cells, each of which is connected to a corresponding common upper/lower bit line. Each column also includes an evaluation circuit coupled to the upper and lower bit lines and configured to evaluate signals on these bit lines and to produce an output signal. Each of the upper and lower bit lines has a bit line delay associated with it, and one of the bit line delays is greater than the other. The evaluation circuit has first and second inputs, each of which has an associated evaluation delay. One of the evaluation circuit inputs has a greater evaluation delay than the other. In each column, the bit line having the greater bit line delay is connected to the evaluation circuit input having the smaller evaluation delay, and the bit line having the smaller bit line delay is connected to the evaluation circuit input having the greater evaluation delay. As a result, neither of the sets of memory cells experiences a read delay that includes both the greater bit line delay and the greater evaluation delay.

Numerous additional embodiments are also possible.

The various embodiments of the present invention may provide a number of advantages over the prior art. In particular, conventional memory systems that use a hierarchical bit line structure have some columns of memory cells in which both the upper and lower halves of the column have an increased number of junctions between the common bit line and the memory cells (i.e., N/2+1, where N is the number of cells connected to the bit line.) As a result, some of the cells in these columns necessarily experience both the greater bit line delay and the greater evaluation circuit delay. In the present systems, on the other hand, none of the columns have the increased number of junctions between the common bit line and the memory cells in both halves of the column, so by ensuring that the bit line with the lower number of junctions (hence the smaller delay) is connected to the evaluation circuit input having the greater delay, the system does not experience as much of a read delay in the worst case. Consequently, the overall read access speed of the memory system is faster than a conventional hierarchical bit line system. The present system also reduces the deviation between the read delays associated with the different memory cells (i.e., the difference between the fastest and slowest read access times is reduced,) which increases the yield of the devices.

BRIEF DESCRIPTION OF THE DRAWINGS

Other objects and advantages of the invention may become apparent upon reading the following detailed description and upon reference to the accompanying drawings.

Figure 1:
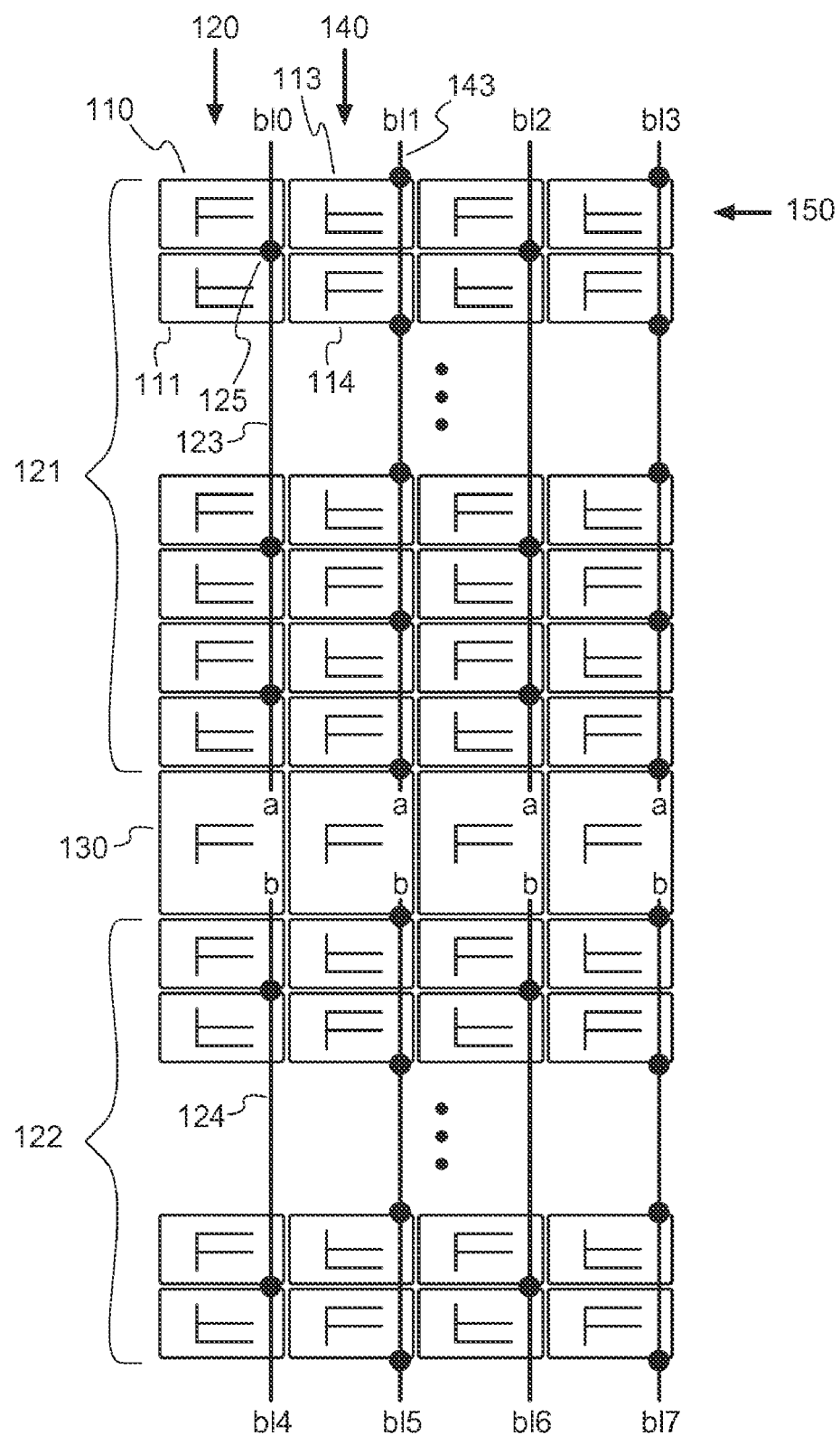
FIG. 1 is a diagram illustrating a portion of a memory system implementing a hierarchical bit line scheme in accordance with the prior art.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for improving memory system performance and by reducing worst-case delays in reading SRAM cells that are coupled together using a hierarchical bit lines scheme. This is accomplished by connecting the cells in upper and lower halves of a column in a memory array to bit lines using different members of junctions between the memory cells and the bit lines, and then coupling the bit line having the greater number of junctions to the faster input of an evaluation circuit and coupling the bit line having the lower number of junctions to the slower input of the evaluation circuit.

In one embodiment, a set of SDRAM memory cells is organized in an array having multiple rows and columns. Each column has in upper half and a lower half, each of which contains half of the column's cells. The cells in the upper half of the column are connected to a corresponding bit line through a particular number of junctions. Adjacent cells in the column are laid out as mirror images of each other so that adjacent cells can share a single junction to the bit line. Thus, if there are N cells in the upper half of the column, there are N/2 junctions between the cells and the bit line.

The cells in the lower half of the column are similarly laid out, but are inverted with respect to the cells of the upper half. Consequently, the cells are connected to the corresponding bit line by one junction more than the upper half. Thus, if there are N cells in the lower half of the column, there are N/2+1 junctions between the cells and the bit line.

Because of the cells of the lower half of the column are connected to the corresponding bit line by a greater number of junctions than the cells of the upper half of the column, the bit line of the lower half has greater capacitance than the bit line of the upper half. The bit line of the lower half is therefore slower than the upper half. Consequently, when a cell in the lower half of the column is read, there is a slight delay with respect to the time it would have taken to read a cell in the upper half.

The bit lines of the upper and lower halves of the column are connected to the inputs of any evaluation circuit. In this environment, the evaluation circuit consists of a NAND gate, the output of which is connected to the gate of an NMOS transistor. The source of the NMOS transistor is coupled to a pre-charged global bit line, while the drain of the transistor is coupled to ground. The evaluation circuit (including the NAND gate and the transistor coupled to the precharged global bit line) therefore acts in the same manner as an AND gate (i.e., the global bit line is high if both the upper and lower bit lines of the column memory cells are high, and is low otherwise.)

Because of the physical structure of the NAND gate, the output of the evaluation circuit reacts more slowly to one of its inputs than the other. By coupling the slower of the two bit lines to the faster input of the evaluation circuit (and coupling the faster bit line to the slower input of the evaluation circuit,) the worst-case delay in reading the memory cells in the column is reduced.

It should be noted that, in order to optimize the physical layout of the memory cells, the higher number of junctions is alternately in the upper and lower halves of the column in succeeding columns. In other words, one column will have the greater number of junctions in its upper half, and the next column will have the greater number of junctions in its lower half, and so on. The evaluation circuits are configured so that the slower bit line (the one with the greater number of junctions) in each column is always coupled to the faster input of the evaluation circuit for that column.

Before describing the exemplary embodiments of the invention in detail, it will be helpful to describe conventional memory cell and read circuitry configurations. Referring to FIG. 1, a diagram illustrating a portion of a memory system implementing a hierarchical bit line scheme is shown. This figure shows an array of SRAM memory cells (e.g., 110) arranged in a series of columns (e.g., 120) and rows (e.g., 150.) Each column has an upper half and a lower half. For example, column 120 has an upper half 121 and a lower half 122. Each half-column has its own common bit line. For instance, the upper half (121) of column 120 includes bit line 123, while the lower half (122) of the column includes a separate bit line 124. Each of the SRAM cells in a half-column is connected to the bit line of that half-column. The connections (junctions) are made at the locations indicated by the dots (e.g., 125) on the bit line.

Each column of the memory cell array includes a local evaluation circuit. For instance, column 120 includes local evaluation circuit 130. Local evaluation circuit 130 has two inputs which are connected to the common bit lines of the upper and lower halves of the column. As depicted in FIG. 1, bit line 123 is connected to a first input (a) of local evaluation circuit 130, while bit line 124 is connected to a second input (b) of the local evaluation circuit. Although not explicitly depicted in FIG. 1, an output of local evaluation circuit 130 is connected to a global bit line.

Each of the columns in the memory array is configured in the same manner as described above.

It should be noted that each SRAM memory cell depicted in FIG. 1 is marked with an "F." The F in a particular cell indicates the orientation of the physical layout of the cell. Each of the evaluation circuits is also marked with an F to indicate the respective orientations of these components. In this case, all of the evaluation circuits have the same orientation.

Each of the memory cells uses a conventional six-transistor configuration. In this configuration, the node of the memory cell which is connected to the bit line (the "bit line node") is in a corner of the area occupied by the cell. In particular, when the memory cell is oriented as indicated by an upright F, this node is in the lower, right-hand corner of the cell. For those cells which are denoted by an inverted F, the layout of the cell is inverted, or flipped top-to-bottom so that the node to be connected to the bit line is in the upper, right-hand corner of the area occupied by the cell.

It can be seen in FIG. 1 that, by inverting successive memory cells in a particular column, the nodes that are to be connected to the bit line are positioned adjacent to each other. Consequently, the two bit line nodes of adjacent cells can be connected to the bit line at a single junction. For example, the bit line node of cell 110 is in the lower, right-hand corner of the cell, while the bit line node of cell 111 is in the upper, right-hand corner of the cell, so that the two nodes can both be connected to the bit line at junction 125. Thus, if there are 16 memory cells in the upper half 121 of column 120, there will be eight junctions between the memory cells and bit line 123.

It should be noted that, as a result of the physical layout of the SRAM cells, cells which are adjacent to each other in different columns (for example, cell 110 and cell 113) should not be constructed as mirror images of each other. The cells should, however, be inverted with respect to each other. Thus, cell 110 has an "upright" orientation indicated by an upright "F," while cell 113 has an inverted orientation indicated by the inverted "F" in the cell. Successive cells in column 140 are inverted with respect to each other similar to the orientation of cells in column 120 in order to reduce the number of junctions between the cells' bit line nodes and the corresponding common bit line 143.

As a result of the fact that adjacent cells in successive columns are inverted with respect to each other, the locations of the bit line nodes of the cells are shifted. For example, the bit line node of cell 113 is in the upper, right-hand corner of the cell, the bit line mode of cell 114 is in the lower, right-hand corner of the cell, and so on. It can be seen from the figure that, with the cells oriented in this manner, one additional junction is required to connect all of the cells in the upper half of column 140 to common bit line 143. Likewise, an additional junction is required to connect all of the cells in the lower half of column 140 to the corresponding common bit line. As a result of the additional junction with each bit line in column 140, there is a slight increase in the capacitance of the bit lines of column 140 with respect to the bit lines of column 120. This increased capacitance causes a slight delay in reading the cells of column 140, as compared to the time required to read the cells of column 120. This delay may, for example, cause the read time to increase by 1%-2%.

As noted above, each of the common bit lines in a column is connected to one of the inputs of a local evaluation circuit for that column. For instance, bit lines 123 and 124 are connected to the inputs of local evaluation circuit 130. Conventionally, the bit lines in the upper halves of the columns are connected to the "a" inputs of the corresponding local evaluation circuits, while the bit lines in the lower halves of the columns are connected to the "b" inputs of the local evaluation circuits.

Figure 2A:
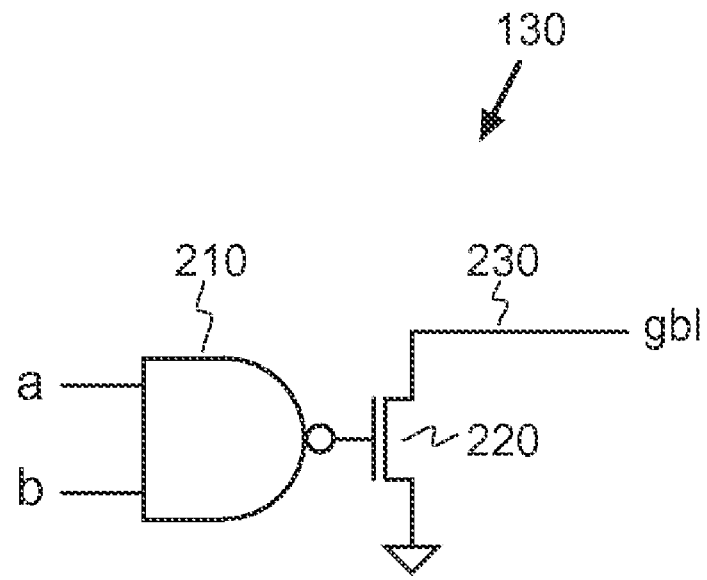
FIG. 2A is a diagram illustrating a local evaluation circuit having a NAND gate coupled to a switching transistor in accordance with the prior art.

Referring to FIG. 2A, local evaluation circuit 130 is typically a NAND gate 210 coupled to a switching transistor 220. Switching transistor 220 is controlled by NAND gate 210 to selectively discharge global bit line 230, which is initially pre-charged to Vdd. When the memory cells in a column are read, selected ones of the cells are coupled to the common bit lines in that column. The common bit lines are also initially pre-charged to Vdd. If the memory cell being read contains a 0, one of the common bit lines is pulled low, so the inputs to NAND gate 210 will be a 0 and a 1, causing the output of the NAND gate to be 1, which switches transistor 220 on, discharging global bit line 230. The pre-charged global bit line 230 will then be read as a 0. If, the other hand, the memory cell contains a 1, both of the common bit lines will be high, so the inputs to NAND gate 210 will both be 1, causing the output of the NAND gate to be 0, which switches off transistor 220. The pre-charged global bit line 230 will then be read as a 1.

Figure 2B:
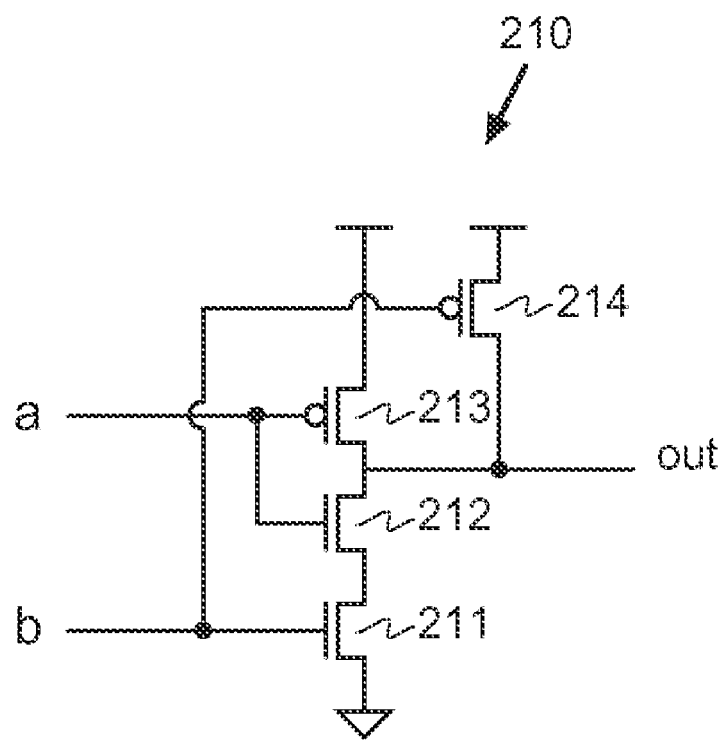
FIG. 2B is a diagram illustrating the structure of a NAND gate in accordance with the prior art.

Referring to FIG. 2B, NAND gate 210 is shown in more detail. As depicted in this figure, the NAND gate consists of four transistors-two NMOS transistors (211, 212) and two PMOS transistors (213, 214.) Because of the physical configuration of NAND gate 210, the line for input b has greater parasitic capacitance than line for input a. As a result, the output of the gate responds more quickly to signals provided at input a than to signals which are provided at input b. This delay may, for example, be on the order of 1%-2%.

Because of the delays resulting from different numbers of junctions to the common bit lines and the different response times of the local evaluation circuits, there is a significant difference in a times required to read different ones of the memory cells. For example, referring again to FIG. 1, memory cells in the upper half (121) of column 120 utilize a common bit line that has the fewest number of junctions, and also uses the faster input (a) of the local evaluation circuit, so these cells require the least amount of time to be read. The worst-case read time is experienced by memory cells in, for example, the lower half of column 140. These cells utilize a common bit line that has the greatest number of junctions and further uses the slower input (b) of the local evaluation circuit. These memory cells therefore experience both types of delays described above. Thus, if the delay caused by each of the sources above is 1%, the total delay would be approximately 2%. If each source of delay added 2% to the read time, the total worst-case delay would be approximately 4%.

In the present system, the worst-case delay is reduced by ensuring that none of the memory cells are subject to both the worst-case bit line delay and the worst-case evaluation circuit delay. This is achieved by connecting the bit line having the greater delay to the input of the evaluation circuit having the smaller delay and connecting the bit line having the smaller delay to the input of the evaluation circuit having the greater delay. While this configuration increases the minimum possible read time, it also decreases the worst-case read time. Because all of the cells are read using the same timing signals, each read access must allow as much time as required for the worst-case read access, so the reduction of the worst-case read time improves the performance of the system.

Figure 3:
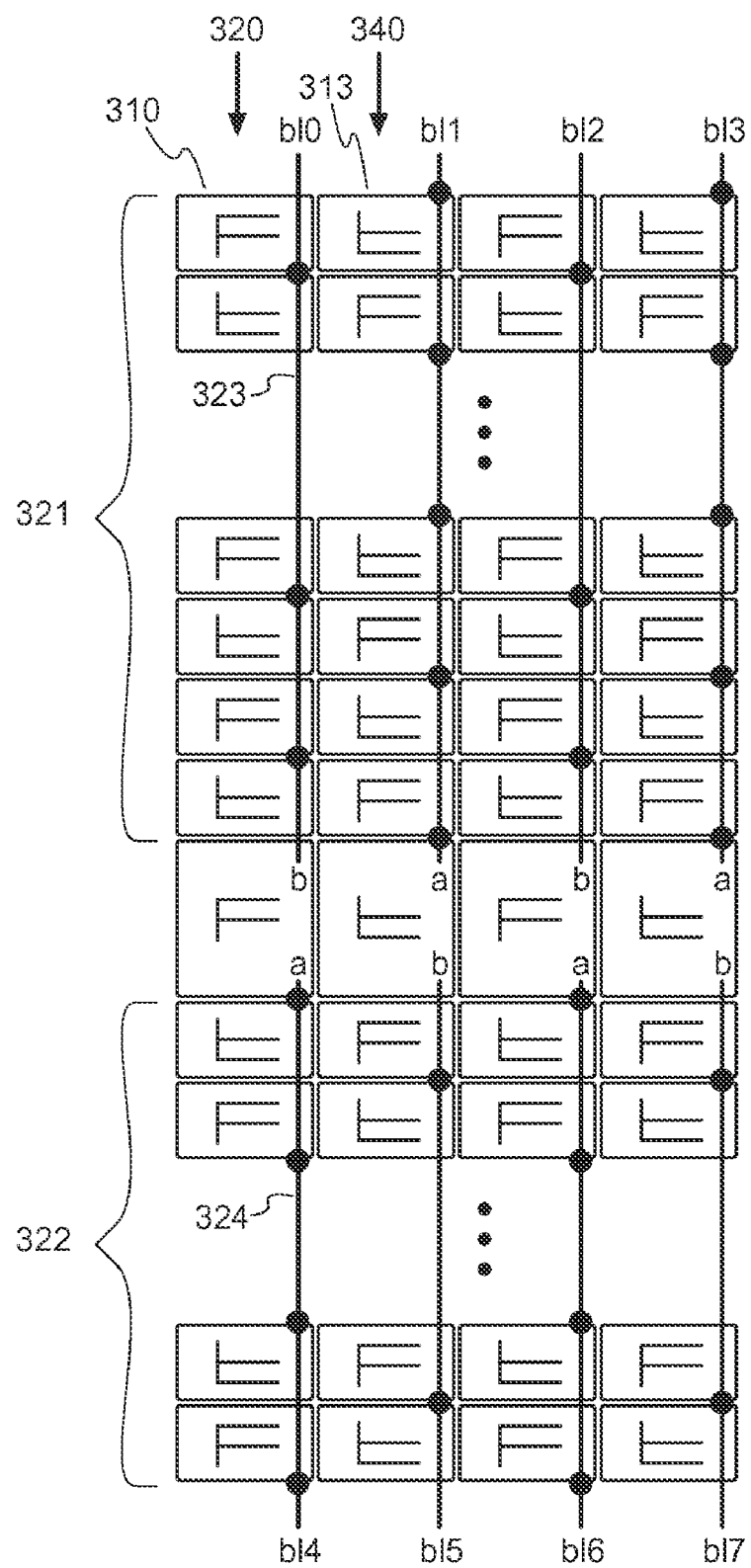
FIG. 3 is a diagram illustrating the structure of a memory system in accordance with an exemplary embodiment of the invention.

Referring to FIG. 3, a diagram illustrating the structure of a memory system in accordance with an exemplary embodiment is shown. Portions of the memory system shown in FIG. 3 are very similar to the corresponding portions of the conventional system shown in FIG. 1. For example, the memory cells are arranged in an array having rows and columns. Each column has an upper half and a lower half, and each half-column contains the same number of memory cells. Each half-column has its own common bit line which is connected to each of the memory cells in that half of the column. Successive ones of the memory cells are inverted with respect each other so that adjacent cells can share a single junction with the common bit line. The two bit lines are connected to the inputs of an evaluation circuit for purposes of reading the memory cells in the column.

While the present system shares these characteristics with the conventional structure described above, there are also significant differences between these two structures. The first difference that should be noted is the fact that the upper and lower halves of each column in the conventional system of FIG. 1 have the same number of junctions, while the upper and lower half-columns in the system of FIG. 3 have different numbers of junctions between the memory cells and the corresponding bit lines.

For example, considering column 320, the cells of the upper half (321) are connected to bit line 323 by a first number of junctions, while the cells of the lower half (322) are connected to bit line 324 by a greater number of junctions. If each half of the column includes a number, N, of memory cells, upper half-column 321 uses N/2 junctions to couple the N memory cells to bit line 323. Lower half-column 322, on the other hand, uses N/2+1 junctions to couple its N memory cells to bit line 324. Thus, the read delay associated with bit line 324 is greater than the read delay associated with bit line 323. By comparison, the read delays of bit lines 123 and 124 in the conventional system are the same.

As noted above, the inputs of the local evaluation circuit have different delays associated with them. In the present system, the bit line having the greater read delay is connected to the evaluation circuit input that has the smaller input delay, and the bit line having the smaller read delay is connected to the evaluation circuit input that has the greater of the two input delays.

The second difference between the conventional structure and the structure illustrated in FIG. 3 is the fact that the local evaluation units in successive ones of the columns are inverted with respect to each other. The local evaluation circuits are inverted to accommodate the inversion of the memory cells. As explained above, adjacent memory cells in different columns (e.g., 310 and 313) are inverted in order to facilitate placement of the cells so that the area required for the cells is minimized. Thus, as also explained above, one half-column will have N/2 junctions between the memory cells in the corresponding bit line, while the adjoining half-column will have N/2+1 junctions. In a system of FIG. 3, this means that the upper and lower half-columns of one column (e.g., 320) will have N/2 and N/2+1 junctions, respectively, while the next column (e.g., 340) will have N/2+1 and N/2 junctions, respectively, in the upper and lower half-columns. In order to connect the bit line having fewer junctions to the slower input of the evaluation circuit (input b) in each column, the evaluation circuits in successive columns are inverted with respect to each other.

It should be noted that the columns and rows referred to herein may in some embodiments be virtual or logical columns and rows. The memory cells in a column or a row need not be aligned with each other. (Components of the system which are described as adjacent to each other should be next to each other, though they are not necessarily aligned with other components.) Similarly, while the columns described above have "upper" and "lower" halves with corresponding upper and lower sets of memory cells and upper and lower bit lines, the terms "upper" and "lower" are used herein only as identifiers and do not imply that the upper components are necessarily positioned above the lower components. Thus, for example, the columns described above could alternatively be described as groups of memory cells, and the upper/lower half-columns, bit lines and sets of cells could alternatively be described as "first" and "second" half-columns, bit lines and sets of cells.

Those of skill will appreciate that the various illustrative logical blocks, modules, and circuits described in connection with the embodiments disclosed herein may be implemented in different ways using application specific integrated circuits (ASICs), field programmable gate arrays (FPGAs) or other programmable logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A system comprising:
a plurality of memory cells organized in a plurality of rows and columns;
wherein each column includes
an upper set of memory cells connected to a common upper bit line,
a lower set of memory cells connected to a common lower bit line, and
an evaluation circuit coupled to the upper and lower bit lines and configured to evaluate signals on the upper and lower bit lines and to produce an output signal therefrom;
wherein for each column
the upper bit line has an upper bit line delay associated therewith,
the lower bit line has a lower bit line delay associated therewith, wherein the upper bit line delay is different from the lower bit line delay, and
the evaluation circuit has a first input and a second input, wherein the first input has an associated first evaluation delay and the second input has an associated second evaluation delay which is greater than the first evaluation delay;
wherein for each column in which the upper bit line delay is greater than the lower bit line delay, the upper bit line is connected to the first input of the evaluation circuit and the lower bit line is connected to the second input of the evaluation circuit; and
wherein for each column in which the upper bit line delay is less than the lower bit line delay, the upper bit line is connected to the second input of the evaluation circuit and the lower bit line is connected to the first input of the evaluation circuit.

2. The system of claim 1, wherein each of the bit lines has an associated capacitance, wherein the delay associated with each bit line is dependent upon the capacitance associated with the bit line.

3. The system of claim 2, wherein each of the bit lines has a set of junctions connecting the corresponding set of memory cells therewith, wherein the capacitance of each bit line is dependent upon the number of junctions connecting the corresponding set of memory cells therewith.

4. The system of claim 3, wherein each set of memory cells has a number N of memory cells and wherein for each column, one of the upper and lower sets of memory cells has N/2 junctions and one of the upper and lower sets of memory cells has N/2+1 junctions.

5. The system of claim 4, wherein for each pair of adjacent columns, one of the columns has N/2 junctions connecting the corresponding upper set of memory cells to the corresponding upper bit line, and one of the columns has N/2+1 junctions connecting the corresponding upper set of memory cells to the corresponding upper bit line.

6. The system of claim 1, wherein for each pair of adjacent columns, the upper bit line delay is greater than the lower bit line delay in one of the columns and the upper bit line delay is less than the lower bit line delay in one of the columns.

7. The system of claim 1, wherein each evaluation circuit comprises a two-input NAND gate.

8. The system of claim 7, wherein each evaluation circuit further comprises an NMOS transistor, wherein an output of the NAND gate is coupled to a gate of the NMOS transistor.

9. The system of claim 8, wherein a source of the NMOS transistor is coupled to a global bit line and a drain of the NMOS transistor is coupled to ground.

10. The system of claim 1, wherein the memory cells are SRAM cells.

11. The system of claim 1, wherein the columns comprise components of a hierarchical bit line structure.

12. A memory system having a hierarchical bit line structure, the system comprising:
a plurality of memory cells organized in a plurality of rows and columns;
wherein each column includes
an upper set of memory cells connected to a common upper bit line,
a lower set of memory cells connected to a common lower bit line, and
an evaluation circuit coupled to the upper and lower bit lines and configured to evaluate signals on the upper and lower bit lines and to produce an output signal therefrom;
wherein for each column
the upper bit line has an upper bit line delay associated therewith,
the lower bit line has a lower bit line delay associated therewith, wherein the upper bit line delay is different from the lower bit line delay, and
the evaluation circuit has a first input, a second input and an output, wherein the first input has an associated first evaluation delay and the second input has an associated second evaluation delay which is greater than the first evaluation delay, and wherein the output is connected to a global bit line;
wherein for each column in which the upper bit line delay is greater than the lower bit line delay, the upper bit line is connected to the first input of the evaluation circuit and the lower bit line is connected to the second input of the evaluation circuit; and
wherein for each column in which the upper bit line delay is less than the lower bit line delay, the upper bit line is connected to the second input of the evaluation circuit and the lower bit line is connected to the first input of the evaluation circuit.

13. The system of claim 12, wherein each of the bit lines has an associated capacitance, wherein the delay associated with each bit line is dependent upon the capacitance associated with the bit line.

14. The system of claim 13, wherein each of the bit lines has a set of junctions connecting the corresponding set of memory cells therewith, wherein the capacitance of each bit line is dependent upon the number of junctions connecting the corresponding set of memory cells therewith.

15. The system of claim 14, wherein each set of memory cells has a number N of memory cells and wherein for each column, one of the upper and lower sets of memory cells has N/2 junctions and one of the upper and lower sets of memory cells has N/2+1 junctions.

16. The system of claim 12, wherein for each pair of adjacent columns, the upper bit line delay is greater than the lower bit line delay in one of the columns and the upper bit line delay is less than the lower bit line delay in one of the columns.

17. The system of claim 12, wherein each evaluation circuit comprises a two-input NAND gate.

18. The system of claim 17, wherein each evaluation circuit further comprises an NMOS transistor, wherein an output of the NAND gate is coupled to a gate of the NMOS transistor.

19. The system of claim 18, wherein a source of the NMOS transistor is coupled to the global bit line and a drain of the NMOS transistor is coupled to ground.

20. A system comprising:
a plurality of memory cells organized in a plurality of groups;
wherein each group includes
a first set of memory cells connected to a common first bit line,
a second set of memory cells connected to a common second bit line, and
an evaluation circuit coupled to the first and second bit lines and configured to evaluate signals on the first and second bit lines and to produce an output signal therefrom;
wherein for each group
the first bit line has an first bit line delay associated therewith,
the second bit line has a second bit line delay associated therewith, wherein the first bit line delay is different from the second bit line delay, and
the evaluation circuit has a first input and a second input, wherein the first input has an associated first evaluation delay and the second input has an associated second evaluation delay which is greater than the first evaluation delay;
wherein for each group in which the first bit line delay is greater than the second bit line delay, the first bit line is connected to the first input of the evaluation circuit and the second bit line is connected to the second input of the evaluation circuit; and
wherein for each column in which the first bit line delay is less than the second bit line delay, the first bit line is connected to the second input of the evaluation circuit and the second bit line is connected to the first input of the evaluation circuit.

* * * * *